(12) United States Patent
Okuda et al.

(10) Patent No.: US 12,266,522 B2
(45) Date of Patent: Apr. 1, 2025

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Kazuyuki Okuda, Toyama (JP); Syuzo Sakurai, Toyama (JP); Yasuhiro Inokuchi, Toyama (JP); Masayoshi Minami, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 18/417,555

(22) Filed: Jan. 19, 2024

(65) Prior Publication Data
US 2024/0153760 A1  May 9, 2024

Related U.S. Application Data

(63) Continuation of application No. 17/744,380, filed on May 13, 2022, now Pat. No. 11,915,927, which is a
(Continued)

(30) Foreign Application Priority Data

Feb. 13, 2019  (JP) .................................. 2019-023380

(51) Int. Cl.
*H01L 21/02*   (2006.01)
*C23C 16/34*   (2006.01)
(Continued)

(52) U.S. Cl.
CPC ........ *H01L 21/0228* (2013.01); *C23C 16/345* (2013.01); *C23C 16/4412* (2013.01);
(Continued)

(58) Field of Classification Search
CPC ............. H01L 21/0228; H01L 21/0217; H01L 21/02274; H01L 21/02126;
(Continued)

(56) References Cited

U.S. PATENT DOCUMENTS

2011/0065289 A1* 3/2011 Asai .................... H01L 21/0228
                                                                  438/791
2012/0073500 A1  3/2012 Sato et al.
(Continued)

FOREIGN PATENT DOCUMENTS

CN   103966576 A   8/2014
CN   107868946 A   4/2018
(Continued)

OTHER PUBLICATIONS

Office action in corresponding Taiwanese Application No. 108145663, Dated Oct. 26, 2020, with English translation.
(Continued)

*Primary Examiner* — Karen Kusumakar
(74) *Attorney, Agent, or Firm* — Edell, Shapiro & Finnan, LLC

(57) ABSTRACT

Described herein is a technique capable of improving the controllability of firm thickness distribution. According to one aspect of the technique, there is provided a substrate processing apparatus including: a process chamber; a first and a second gas supply system; an exhaust system; and a controller for controlling the first and the second gas supply system and the exhaust system to form a film. The first gas supply system includes: a first and a second storage part; a first gas supply port for supplying a gas stored in the first storage part from an outer periphery toward a center of a substrate; and a second gas supply for supplying the gas stored in the second storage part from the outer periphery along a direction more inclined toward the outer periphery
(Continued)

than a direction from the outer periphery toward the center of the substrate.

17 Claims, 6 Drawing Sheets

Related U.S. Application Data continuation of application No. 16/787,896, filed on Feb. 11, 2020, now Pat. No. 11,361,961.

(51) Int. Cl.
| | |
|---|---|
| *C23C 16/44* | (2006.01) |
| *C23C 16/458* | (2006.01) |
| *C23C 16/50* | (2006.01) |
| *C23C 16/52* | (2006.01) |
| *H01J 37/32* | (2006.01) |

(52) U.S. Cl.
CPC ......... *C23C 16/4583* (2013.01); *C23C 16/50* (2013.01); *C23C 16/52* (2013.01); *H01J 37/32449* (2013.01); *H01J 37/32715* (2013.01); *H01J 37/32834* (2013.01); *H01L 21/0217* (2013.01); *H01L 21/02274* (2013.01); *H01J 37/32541* (2013.01); *H01J 2237/3321* (2013.01)

(58) Field of Classification Search
CPC ......... H01L 21/02211; H01L 21/67017; H01L 21/67207; C23C 16/345; C23C 16/4412; C23C 16/4583; C23C 16/50; C23C 16/52; C23C 16/45502; C23C 16/45542; C23C 16/45546; C23C 16/45561; C23C 16/45578; C23C 16/4584; C23C 16/509; C23C 16/45523; C23C 16/45544; C23C 16/45574; C23C 16/34; H01J 37/32449; H01J 37/32715; H01J 37/32834; H01J 37/32541; H01J 2237/3321

See application file for complete search history.

(56) References Cited

U.S. PATENT DOCUMENTS

| | | |
|---|---|---|
| 2014/0213069 A1 | 7/2014 | Takebayashi et al. |
| 2018/0087156 A1* | 3/2018 | Fukushima ......... C23C 16/4584 |
| 2018/0209043 A1 | 7/2018 | Lau et al. |
| 2019/0019705 A1 | 1/2019 | Nakada et al. |

FOREIGN PATENT DOCUMENTS

| | | |
|---|---|---|
| CN | 108885993 A | 11/2018 |
| JP | 2011-29441 A | 2/2011 |
| JP | 2012-94652 A | 5/2012 |
| JP | 2016-181545 A | 10/2016 |

OTHER PUBLICATIONS

First Office Action Notification with English translation in Chinese Application No. 202010088914.3, dated Mar. 1, 2023, 18 pages.

\* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

This application is a continuation of U.S. patent application Ser. No. 17/744,380 filed on May 13, 2022, which is a continuation of U.S. patent application Ser. No. 16/787,896, filed on Feb. 11, 2020, which claims foreign priority under 35 U.S.C. § 119(a)-(d) to Application No. JP 2019-023380, filed on Feb. 13, 2019, the entire contents of which are hereby incorporated by reference.

TECHNICAL FIELD

The present disclosure relates to a substrate processing apparatus, a method of manufacturing a semiconductor device and a non-transitory computer-readable recording medium.

BACKGROUND

As one of manufacturing processes of a semiconductor device, a step of forming a film on a substrate may be performed.

SUMMARY

Described herein is a technique capable of improving the controllability of a thickness distribution of a film formed on a substrate.

According to one aspect of the technique of the present disclosure, there is provided a substrate processing apparatus including: a process chamber in which a substrate is capable of being accommodated; and a gas supply system configured to supply a first process gas into the process chamber, wherein the gas supply system includes: a first gas supply port configured to supply the first process gas to the substrate from an outer periphery of the substrate along a first supply direction; a second gas supply port configured to supply the first process gas to the substrate from the outer periphery of the substrate along a second supply direction more inclined toward a tangential direction of the substrate from the second gas supply port than a direction parallel to the first supply direction; and a storage part configured to temporarily store the first process gas to be supplied to at least one of the first gas supply port or the second gas supply port.

DETAILED DESCRIPTION

Embodiments

Figure 1:
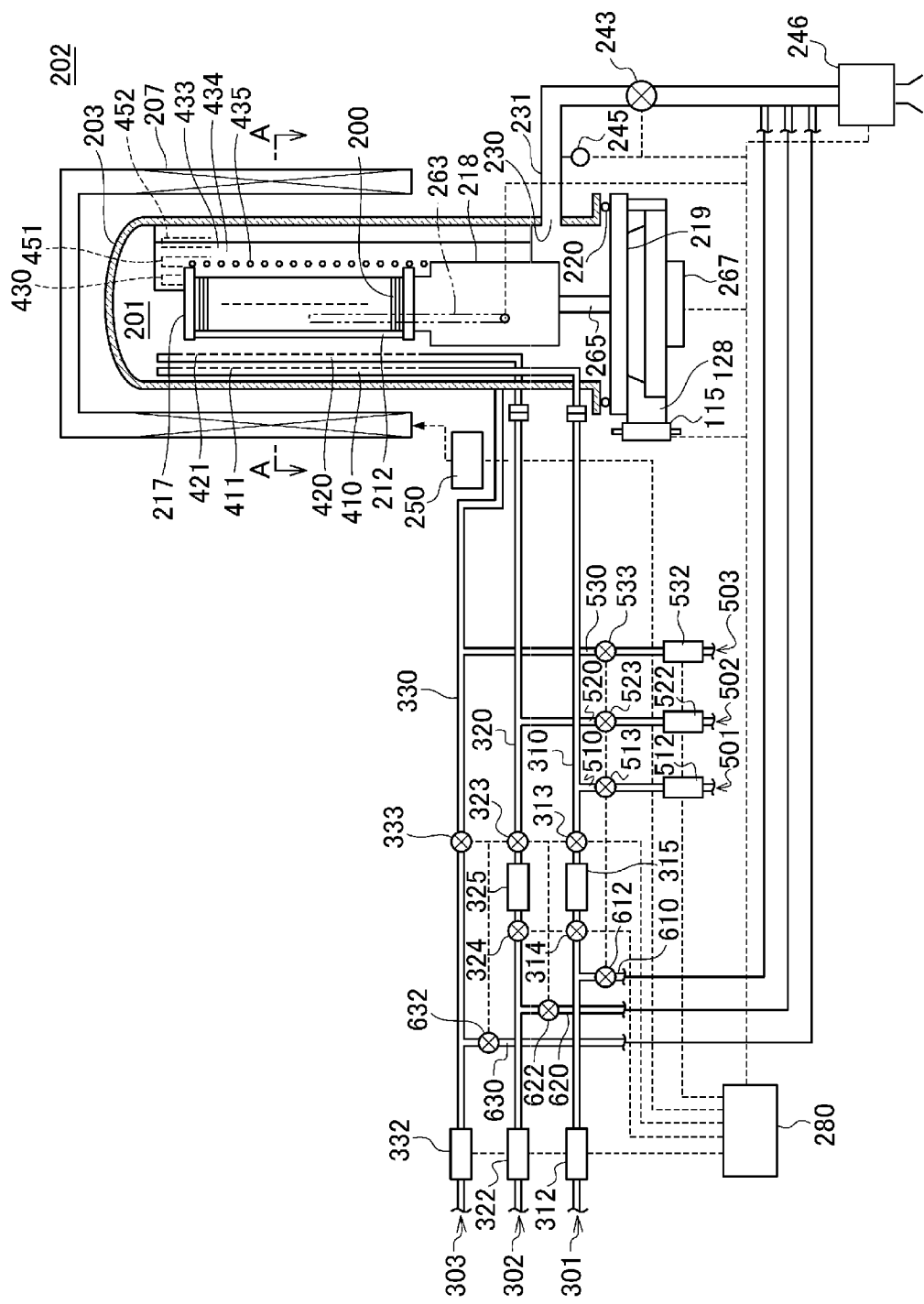
FIG. 1 schematically illustrates a vertical cross-section of a vertical type process furnace of a substrate processing apparatus according to one or more embodiments described herein.

Hereinafter, one or more embodiments (hereinafter, simply referred to as "embodiments") according to the technique of the present disclosure will be described. The embodiments according to the technique of the present disclosure will be described mainly with reference to FIGS. 1 through 4.

(1) Configuration of Substrate Processing Apparatus

A substrate processing apparatus according to the embodiments described herein includes a vertical type process furnace (hereinafter, simply referred to as a "process furnace") 202. The process furnace 202 includes a reaction tube 203. The reaction tube 203 is made of a heat resistant material such as quartz ($SiO_2$) and silicon carbide (SiC). A heater 207 serving as a heating apparatus (also referred to as a "heating mechanism") is provided outside the reaction tube 203 so as to be concentric with the reaction tube 203. A heating power supply 250 is connected to the heater 207. A seal cap 219 serving as a furnace opening cover is provided under the reaction tube 203. An O-ring 220 serving as a sealing part is provided between a lower end of the reaction tube 203 and an upper surface of the seal cap 219. The seal cap 219 is made of a metal such as stainless steel (SUS), and is capable of airtightly closing (sealing) a lower end opening of the reaction tube 203. A process chamber 201 is defined by an inside of the reaction tube 203. The process chamber 201 is configured to accommodate a plurality of wafers including a wafer 200 serving as a substrate.

A boat support 218 configured to support a boat 217 serving as a substrate retainer is provided on the seal cap 219. The boat 217 includes a bottom plate fixed on the boat support 218 and a top plate disposed above the bottom plate. A plurality of support columns is provided between the bottom plate and the top plate so as to connect the bottom plate and the top plate. The plurality of the wafers including the wafer 200 is stacked (loaded) on the plurality of the support columns of the boat 217 in multiple stages with a predetermined interval therebetween with their centers aligned with each other. A stacking direction of the plurality of the wafers is equal to an axial direction of the reaction tube 203. For example, the boat support 218, the bottom plate, the top plate and the plurality of the support columns are made of the heat resistant material described above. A rotating mechanism 267 is provided at the seal cap 219 opposite to the process chamber 201. A rotating shaft 265 of the rotating mechanism 267 is connected to the boat support 218 through the seal cap 219. As the rotating mechanism 267 rotates the rotating shaft 265, the boat 217 and the plurality of the wafers including the wafer 200 supported by the boat 217 are rotated. The seal cap 219 may be moved upward or downward in the vertical direction by a boat elevator 115. The boat elevator 115 serves as a transfer mechanism configured to transfer the boat 217 and the plurality of the wafers supported by the boat 217 into or out of the process chamber 201.

Nozzles 410, 420 and 430 are provided in the process chamber 201 to penetrate a lower side wall of the reaction tube 203. Gas supply pipes 310, 320 and 330 are connected to the nozzles 410, 420 and 430, respectively.

Mass flow controllers (MFCs) 312 and 322 serving as flow rate controllers (flow rate control mechanisms), valves 314 and 324 serving as opening/closing valves, buffer tanks 315 and 325 serving as storage parts and valves 313 and 323 are sequentially installed at the gas supply pipes 310 and 320, respectively, from upstream sides to downstream sides of the gas supply pipes 310 and 320. Vent gas pipes 610 and 620 are connected to the gas supply pipes 310 and 320, respectively, between the MFCs 312 and 322 and the valves 314 and 324 of the gas supply pipes 310 and 320. The vent gas pipes 610 and 620 are connected to a downstream side of an APC valve 243 of an exhaust pipe 231 described later. Valves 612 and 622 are provided at the vent gas pipes 610 and 620, respectively. Gas supply pipes 510 and 520 configured to supply an inert gas are connected to the gas supply pipes 310 and 320, respectively, at downstream sides of the valves 313 and 323 of the gas supply pipes 310 and 320. MFCs 512 and 522 and valves 513 and 523 are sequentially installed at the gas supply pipes 510 and 520, respectively, from upstream sides to downstream sides of the gas supply pipes 510 and 520.

Downstream ends of the gas supply pipes 310 and 320 are connected to upstream ends of the nozzles 410 and 420, respectively. The nozzles 410 and 420 are installed in an annular space between an inner wall of the reaction tube 203 and the plurality of the wafers including the wafer 200 accommodated in the process chamber 201, and extend from a lower portion of the inner wall of the reaction tube 203 to an upper portion of the inner wall of the reaction tube 203 along the stacking direction of the plurality of the wafers, respectively. Each of the nozzles 410 and 420 may be constituted by an L-shaped nozzle. A plurality of gas supply ports including a gas supply port 411 (hereinafter also referred to as "gas supply ports 411") and a plurality of gas supply ports including a gas supply port 421 (hereinafter also referred to as "gas supply ports 421") are provided on side portions (side surfaces) of the nozzles 410 and 420 at positions facing the plurality of the wafers including the wafer 200. Each of the gas supply ports 411 and 421 are constituted by a circular hole, but each of them may be constituted by an opening of another shape such as ellipse, square, and rectangular shape. The opening areas of gas supply ports 411 are the same or increase upward or downward, and the opening areas of the gas supply ports 421 are the same or increase upward or downward. The gas supply ports 411 and 421 are disposed at positions respectively corresponding to the plurality of wafers including the wafer 200 with the same pitch therebetween.

Each of buffer tanks 315 and 325 may be constituted by a component such as a gas tank or a spiral pipe whose gas capacity is greater than that of a normal pipe. By opening and closing the valves 314 and 324 provided on upstream sides of the buffer tanks 315 and 325 and the valves 313 and 323 provided on downstream sides of the buffer tanks 315 and 325, a gas supplied through the gas supply pipes 310 and 320 may be temporarily filled (stored) in the buffer tanks 315 and 325, respectively, and the gas temporarily stored in each of the buffer tanks 315 and 325 may be supplied into the process chamber 201. It is preferable that a conductance between the buffer tanks 315 and 325 and the process chamber 201 is $1.5 \times 10^{-3}$ m3/s or more, for example. When a volume of the reaction tube 203 is 100 liters, it is preferable that a volume of the buffer tank 315 is set to a predetermined volume ranging from 100 cc to 300 cc, for example.

By closing the valves 313, 323, 612 and 622 and opening the valves 314 and 324, the gas whose flow rate is adjusted by the MFCs 312 and 322 may be temporarily stored in the buffer tanks 315 and 325. By closing the valves 314 and 324 and opening the valves 313 and 323 after a predetermined amount of the gas is stored in the buffer tanks 315 and 325 and inner pressures of the buffer tanks 315 and 325 reach a predetermined pressure, the gas stored in each of the buffer tanks 315 and 325 with high pressure may be supplied into the process chamber 201 at once (in a short time) through the gas supply pipes 310 and 320 and the nozzles 410 and 420. When the gas is supplied into the process chamber 201, by opening the valves 513 and 523, the inert gas whose flow rate is adjusted by the MFCs 512 and 522 may also be supplied into the process chamber 201 through the gas supply pipes 310 and 320 and the nozzles 410 and 420. In addition, by closing the valves 314 and 324 and opening the valves 612 and 622, the gas whose flow rate is adjusted by the MFCs 312 and 322 may be made to bypass without being supplied into the process chamber 201, and exhausted to the exhaust pipe 231 through the vent gas pipes 610 and 620. In addition, by closing the valves 313 and 323 and opening the valves 513 and 523, the inert gas whose flow rate is adjusted by the MFCs 512 and 522 may be supplied into the process chamber 201 through the gas supply pipes 310 and 320 and the nozzles 410 and 420, respectively, so as to purge an inner atmosphere of the process chamber 201.

For example, as a first process gas, a source gas containing silicon (Si) which is a main element (predetermined element) constituting a film is supplied into the process chamber 201 through the gas supply pipes 310 and 320 provided with the MFCs 312 and 322 and the valves 314 and 324, the buffer tanks 315 and 325 and the valves 313 and 323, and the nozzles 410 and 420.

For example, a chlorosilane-based gas such as dichlorosilane ($SiH_2Cl_2$, abbreviated as DCS), trichlorosilane ($SiHCl_3$, abbreviated as TCS), tetrachlorosilane ($SiCl_4$, abbreviated as STC), hexachlorodisilane ($Si_2Cl_6$, abbreviated as HCDS) may be used as the source gas containing silicon. In addition, a gas such as a fluorosilane-based gas such as tetrafluorosilane ($SiF_4$) gas, an inorganic silane-based gas such as disilane ($Si_2H_6$, abbreviated as DS) and an aminosilane-based gas such as trisdimethylaminosilane ($Si[N(CH_3)_2]_3H$, abbreviated as 3DMAS) may be used as the source gas containing silicon.

For example, as the inert gas, nitrogen ($N_2$) gas or a rare gas such as argon (Ar) gas, helium (He) gas, neon (Ne) gas and xenon (Xe) gas is supplied into the process chamber 201 through the gas supply pipes 510 and 520 provided with the MFCs 512 and 522 and the valves 513 and 523, the gas supply pipes 310 and 320 and the nozzles 410 and 420.

A first gas supply system (also referred to as "source gas supply systems") 301 and 302 is constituted mainly by the gas supply pipes 310 and 320, the MFCs 312 and 322, the valves 314 and 324, the buffer tanks 315 and 325, the valves 313 and 323 and nozzles 410 and 420. A first inert gas supply systems 501 and 502 is constituted mainly by the gas supply pipes 510 and 520, the MFCs 512 and 522 and the valves 513 and 523.

An MFC 332 and a valve 333 are sequentially installed at the gas supply pipe 330 from an upstream side to a downstream side of the gas supply pipe 330. A vent gas pipe 630 is connected to the gas supply pipe 330 between the MFC 332 and the valve 333 of the gas supply pipe 330. The vent gas pipe 630 is connected to the downstream side of the APC valve 243 of the exhaust pipe 231 described later. A valve 632 is provided at the vent gas pipe 630. A gas supply pipe 530 configured to supply the inert gas is connected to the gas supply pipe 330 at a downstream side of the valve 333 of the gas supply pipe 330. An MFC 532 and a valve 533 are sequentially installed at the gas supply pipe 530 from an upstream side to a downstream side of the gas supply pipe 530.

The gas supply pipe 330 is connected to the nozzle 430. The nozzle 430 is provided in a buffer chamber 433 serving as a gas dispersion space. Electrode protection pipes 451 and 452 described later are provided in the buffer chamber 433. The nozzle 430 and the electrode protection pipes 451 and 452 are arranged in this order in the buffer chamber 433 along the inner wall of the reaction tube 203.

The buffer chamber 433 is defined by the inner wall of the reaction tube 203 and a buffer chamber wall 434. The buffer chamber wall 434 is installed in the annular space between the inner wall of the reaction tube 203 and the plurality of the wafers including the wafer 200 accommodated in the process chamber 201 in a portion extending from the lower portion to the upper portion of the inner wall of the reaction tube 203 along the stacking direction of the plurality of the wafers including the wafer 200. A plurality of gas supply ports including a gas supply port 435 (hereinafter also referred to as "gas supply ports 435") configured to supply a gas is provided on a portion of the buffer chamber wall 434 adjacent to the plurality of the wafers. The gas supply ports 435 are provided between the electrode protection pipe 451 and the electrode protection pipe 452, and are opened toward a center of the reaction tube 203. The gas supply ports 435 are arranged from a lower portion to an upper portion of the reaction tube 203, and have the same opening area and the same pitch.

The nozzle 430 is installed on one side of the buffer chamber 433, and extends from the lower portion of the inner wall of the reaction tube 203 to the upper portion of the inner wall of the reaction tube 203 along the stacking direction of the plurality of the wafers. The nozzle 430 may be constituted by an L-shaped nozzle. A plurality of gas supply ports including a gas supply port 431 (hereinafter also referred to as "gas supply ports 431") is provided on a side surface of the nozzle 430 at positions facing the plurality of the wafers including the wafer 200. The gas supply ports 431 are opened toward a center of the buffer chamber 433. Similar to the gas supply ports 435 of the buffer chamber 433, the gas supply ports 431 are provided from the lower portion to the upper portion of the reaction tube 203.

By opening the valve 333, the gas whose flow rate is adjusted by the MFC 332 may be supplied into the process chamber 201 through the gas supply pipe 330, the nozzle 430 and the buffer chamber 433. When the gas is supplied into the process chamber 201, by opening the valve 533, the inert gas whose flow rate is adjusted by the MFC 532 may also be supplied into the process chamber 201 through the gas supply pipe 330, the nozzle 430 and the buffer chamber 433. In addition, by closing the valve 333 and opening the valve 632, the gas whose flow rate is adjusted by the MFC 332 may be made to bypass without being supplied into the process chamber 201, and exhausted to the exhaust pipe 231 through the vent gas pipe 630. In addition, by closing the valve 333 and opening the valve 533, the inert gas whose flow rate is adjusted by the MFC 532 may be supplied into the process chamber 201 through the gas supply pipe 330, the nozzle 430 and the buffer chamber 433 to thereby purge the inner atmosphere of the process chamber 201.

For example, as a second process gas having a chemical structure (molecular structure) different from that of the first process gas, a nitrogen (N)-containing gas serving as a nitriding gas (nitriding agent) is supplied into the process chamber 201 through the gas supply pipe 330 provided with the MFC 332 and the valve 333, the nozzle 430 and the buffer chamber 433. For example, a hydrogen nitride-based gas such as ammonia ($NH_3$) gas, diazene ($N_2H_2$) gas, hydrazine ($N_2H_4$) gas and $N_3H_8$ gas may be used as the nitriding gas.

For example, as the inert gas, the nitrogen ($N_2$) gas or the rare gas described above is supplied into the process chamber 201 through the gas supply pipe 530 provided with the MFC 532 and the valve 533, the gas supply pipe 330, the nozzle 430 and the buffer chamber 433.

A second gas supply system (also referred to as a "nitriding gas supply system") 303 is constituted mainly by the gas supply pipe 330, the MFC 332, the valve 333, the nozzle 430 and buffer chamber 433. A second inert gas supply system 503 is constituted mainly by the gas supply pipe 530, the MFC 532 and the valve 533.

Rod-shaped electrodes 471 and 472 of a thin and long structure are provided in the buffer chamber 433, and extend from the lower portion of the reaction tube 203 to the upper portion of the reaction tube 203 along the stacking direction of the plurality of the wafers including the wafer 200. Each of the rod-shaped electrodes 471 and 472 is provided parallel to the nozzle 430. The rod-shaped electrodes 471 and 472 are covered and protected by the electrode protection pipes 451 and 452, respectively. The rod-shaped electrode 471 is connected to a high frequency power supply 270 via a matching device 271, and the rod-shaped electrode 472 is connected to an electrical ground 272 serving as a reference potential. By applying high frequency power from the high frequency power supply 270 to the rod-shaped electrodes 471 and 472 via the matching device 271, plasma is generated in a plasma generation region between the rod-shaped electrodes 471 and 472. A plasma generator is constituted mainly by the rod-shaped electrodes 471 and 472, the electrode protection pipes 451 and 452 and the buffer chamber 433. The plasma generator may further include the matching device 271 and the high frequency power supply 270. The plasma generator functions as an activation mechanism (also referred to as an "excitation mechanism") configured to activate (excite) the gas such as the second process gas with the plasma.

According to the embodiments, an electric field is generated so as to surround the rod-shaped electrodes 471 and 472, and the plasma is generated. Active species contained in the plasma may flow into the process chamber 201 through the gas supply port 435, and may be supplied toward a center of the wafer 200 through an outer periphery of the wafer 200. According to the embodiments, the substrate processing apparatus is configured as a vertical type batch processing apparatus, and the buffer chamber 433 is disposed at a position close to the wafer 200 to be processed. Therefore, the active species may be easily supplied onto a surface of the wafer 200 without being deactivated. In addition, since the rod-shaped electrodes 471 and 472 are accommodated in the buffer chamber 433, ions that may damage the wafer 200 hardly enter the process chamber 201.

An exhaust port 230 is provided at the lower portion of the reaction tube 203. The exhaust pipe 231 configured to exhaust the inner atmosphere of the process chamber 201 is connected to the exhaust port 230. A pressure sensor 245, the APC (Automatic Pressure Controller) valve 243 and a vacuum pump 246 are sequentially installed at the exhaust pipe 231 from an upstream side to a downstream side of the exhaust pipe 231. The pressure sensor 245 serves as a pressure detector that detects an inner pressure of the process chamber 201, the APC valve 243 serves as a pressure controller (pressure adjusting mechanism), and the vacuum pump 246 serves as a vacuum exhausting apparatus. With the vacuum pump 246 in operation, the APC valve 243 may be opened or closed to vacuum-exhaust the process chamber 201 or stop the vacuum exhaust. With the vacuum pump 246 in operation, an opening degree of the APC valve 243 may be adjusted in order to control the inner pressure of the process chamber 201. An exhaust system is constituted mainly by the exhaust pipe 231, the APC valve 243 and the pressure sensor 245. The exhaust system may further include the vacuum pump 246.

The nozzle 410 is provided at a position facing the exhaust port 230 via a center 200c of the wafer 200 accommodated in the process chamber 201, that is, at a position opposite to the exhaust port 230 by 180°.

Figure 2:
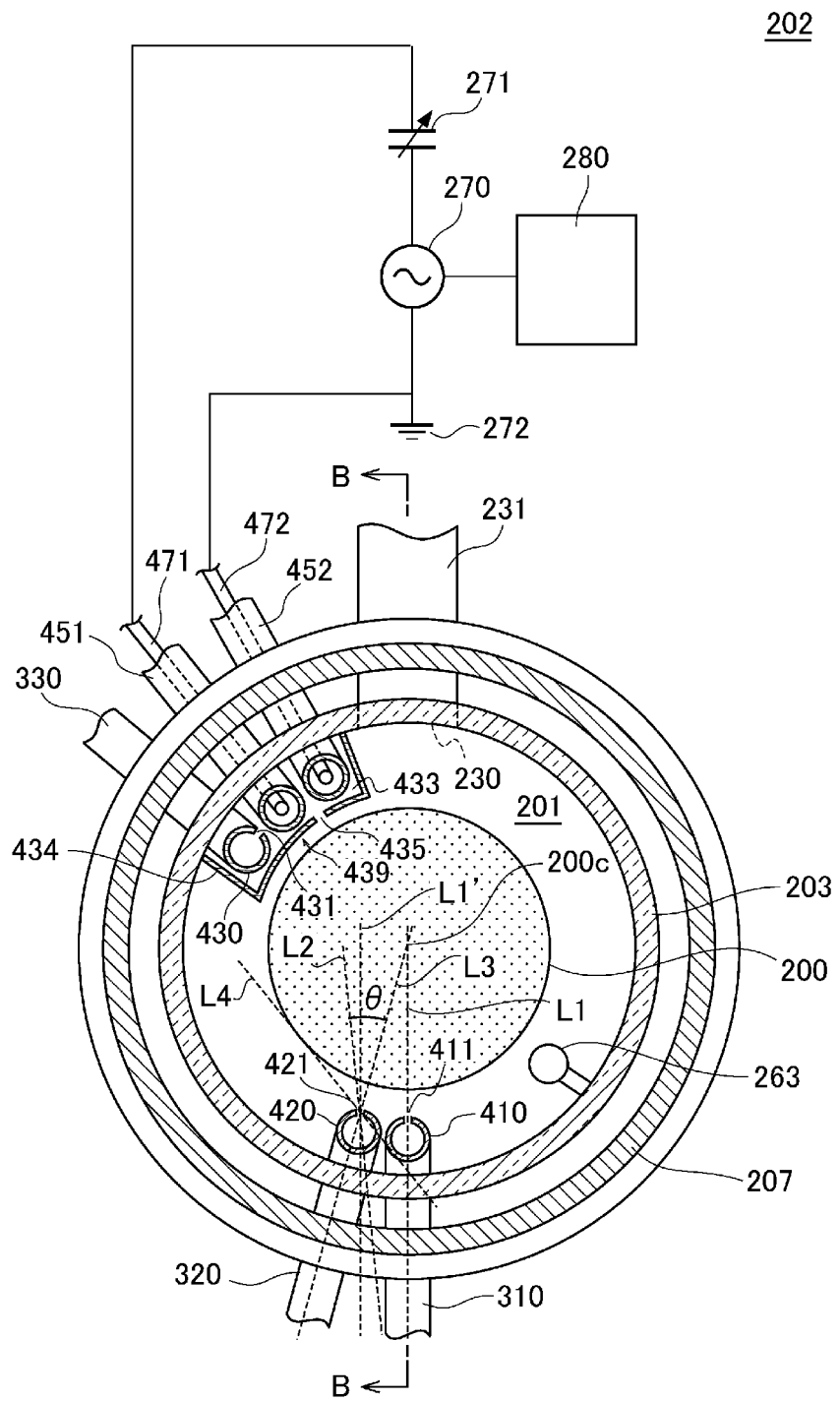
FIG. 2 schematically illustrates a cross-section taken along the line A-A of the vertical type process furnace of the substrate processing apparatus according to the embodiments shown in FIG. 1.

The gas supply ports 411 are configured to supply the first process gas stored in the buffer tank 315 toward the center 200c of the wafer 200 through the outer periphery of the wafer 200. A straight line L1 shown in FIG. 2 is a straight line connecting the gas supply port 411 and the center 200c of the wafer 200. The gas supplied through the gas supply port 411 flows toward the center 200c of the wafer 200 along the straight line L1 shown in FIG. 2. Hereinafter, the direction of the gas flow supplied through the gas supply port 411 is also simply referred to as an "L1 direction".

The nozzle 420 is provided so as to be adjacent to the nozzle 410 along an inner wall of the process chamber 201, that is, to be adjacent to the nozzle 410 along a circumferential direction of the wafer 200 accommodated in the process chamber 201. That is, the gas supply ports 411 are provided adjacent to the gas supply ports 421 along the circumferential direction of the wafer 200 accommodated in the process chamber 201.

The gas supply ports 421 are configured to supply the first process gas stored in the buffer tank 325 from the outer periphery of the wafer 200 along a direction more inclined toward the outer periphery of the wafer 200 than a direction from the outer periphery of the wafer 200 toward the center 200c of the wafer 200. A straight line L3 shown in FIG. 2 is a straight line connecting the gas supply port 421 and the center 200c of the wafer 200, and a straight line L4 is a straight line (tangent line) connecting the gas supply port 421 and the outer periphery of the wafer 200. The gas supplied through the gas supply port 421 flows along a straight line L2 shown in FIG. 2. That is, the gas flows along a direction which is closer to a direction of the straight line L4 (hereinafter, simply referred to as an "L4 direction") than to a direction of the straight line L3 (hereinafter, simply referred to as an "L3 direction"). Hereinafter, a direction of the gas flow supplied through the gas supply port 421 will be also simply referred to as an "L2 direction". The L2 direction is a predetermined direction between the L3 direction and the L4 direction.

Specifically, the gas supply ports 421 are configured to supply the first process gas stored in the buffer tank 325 toward the outer periphery of the wafer 200 in a direction of a predetermined angle ranging from, for example, 24° to 30° with respect to the L3 direction. That is, an angle (center angle) θ between the L3 direction and the L2 direction is the predetermined angle ranging from 24° to 30°, for example.

The gas supply ports 421 are configured to supply the first process gas stored in the buffer tank 325 in a direction more inclined toward the outer periphery of the wafer 200 than a direction (which is a direction along a straight line L 1 ' shown in FIG. 2, and will be also referred to as an "L1' direction") parallel to the L1 direction described above in which the first process gas is supplied through the gas supply port 411.

The gas supply ports 435 of a plasma generation structure 439 are provided at a predetermined distance from the nozzles 410 and 420 along the inner wall of the process chamber 201, that is, along the circumferential direction of the wafer 200 accommodated in the process chamber 201. An angle (center angle) between a straight line connecting the gas supply port 435 and the center 200c of the wafer 200 and the straight line L1 is a predetermined angle ranging from 90° to 180°, for example.

A temperature sensor 263 serving as a temperature detector is provided in the reaction tube 203. The power supplied to the heater 207 from the heating power supply 250 is adjusted based on temperature information detected by the temperature sensor 263 such that an inner temperature of the process chamber 201 has a desired temperature distribution.

Figure 3:
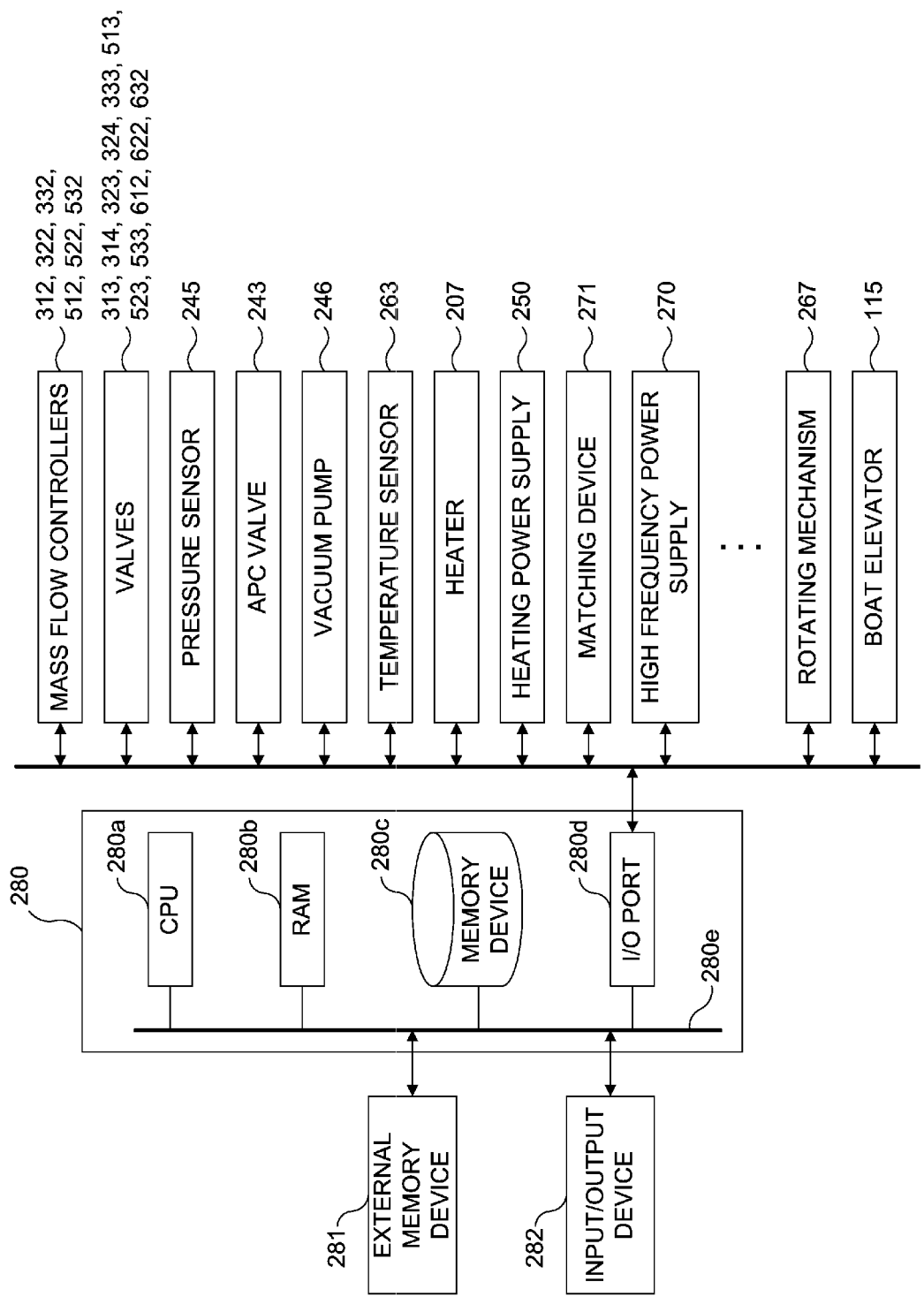
FIG. 3 is a block diagram schematically illustrating a configuration of a controller and related components of the substrate processing apparatus according to the embodiments described herein.

As shown in FIG. 3, a controller 280 serving as a control device (control mechanism) is embodied by a computer including a CPU (Central Processing Unit) 280a, a RAM (Random Access Memory) 280b, a memory device 280c and an I/O port 280d. The RAM 280b, the memory device 280c and the I/O port 280d may exchange data with the CPU 280a through an internal bus 280e. For example, an input/output device 282 such as a touch panel (not shown) may be connected to the controller 280.

The memory device 280c may be embodied by components such as a flash memory and a hard disk drive (HDD). Components such as a control program configured to control the operation of the substrate processing apparatus and a process recipe in which information such as the sequential order and the conditions of a substrate processing described later is stored may be readably stored in the memory device 280c. The process recipe is obtained by combining steps of the substrate processing described later such that the controller 280 can execute the steps to acquire a predetermine result, and functions as a program. Hereinafter, the process recipe and the control program may be collectively referred to as a "program", and the process recipe may be simply referred to as a "recipe". In the present specification, the term "program" may indicate only the recipe, may indicate only the control program, or may indicate both of the recipe and the control program. The RAM 280b functions as a memory area (work area) where a program or data read by the CPU 280a is temporarily stored.

The I/O port 280d is connected to components such as the MFCs 312, 322, 332, 512, 522 and 532, the valves 313, 314, 323, 324, 333, 513, 523, 533, 612, 622 and 632, the pressure sensor 245, the APC valve 243, the vacuum pump 246, the heater 207, the heating power supply 250, the temperature sensor 263, the high frequency power supply 270, the matching device 271, the rotating mechanism 267 and the boat elevator 115.

The CPU 280a is configured to read the control program from the memory device 280c and execute the read control program. Furthermore, the CPU 280a is configured to read a recipe such as the process recipe from the memory device 280c according to an operation command inputted from the input/output device 282. According to the contents of the read recipe, the CPU 280a may be configured to control various operations such as flow rate adjusting operations for various gases by the MFCs 312, 322, 332, 512, 522 and 532, opening/closing operations of the valves 313, 314, 323, 324, 333, 513, 523, 533, 612, 622 and 632, an opening/closing operation of the APC valve 243, a pressure adjusting operation by the APC valve 243 based on the pressure sensor 245, a start and stop of the vacuum pump 246, a temperature adjusting operation of the heater 207 (or an output adjusting operation of the heating power supply 250) based on the temperature sensor 263, an operation of supplying power by the high frequency power supply 270, an impedance adjusting operation by the matching device 271, a rotation operation and rotation speed adjusting operation of the boat 217 by the rotating mechanism 267, and an elevating and lowering operation of the boat 217 by the boat elevator 115.

The controller 280 may be embodied by installing the above-described program stored in an external memory device 281 into a computer. For example, the external memory device 281 may include a magnetic disk such as a hard disk drive (HDD), an optical disk such as a CD, a magneto-optical disk such as an MO, and a semiconductor memory such as a USB memory. The memory device 280c or the external memory device 281 may be embodied by a non-transitory computer readable recording medium. Hereafter, the memory device 280c and the external memory device 281 are collectively referred to as recording media. In the present specification, the term "recording media" may indicate only the memory device 280c, indicate only the external memory device 281, or indicate both of the memory device 280c and the external memory device 281. Instead of the external memory device 281, a communication means such as the Internet and a dedicated line may be used to provide the program to the computer.

(2) Substrate Processing

Hereinafter, an exemplary sequence of the substrate processing (that is, an exemplary sequence of a film-forming process) of forming a film on the wafer 200 serving as a substrate, which is a part of manufacturing processes of a semiconductor device, will be described with reference to FIG. 4. The exemplary sequence of the film-forming process is performed by using the substrate processing apparatus described above. Hereinafter, the operations of the components constituting the substrate processing apparatus are controlled by the controller 280.

Figure 4:
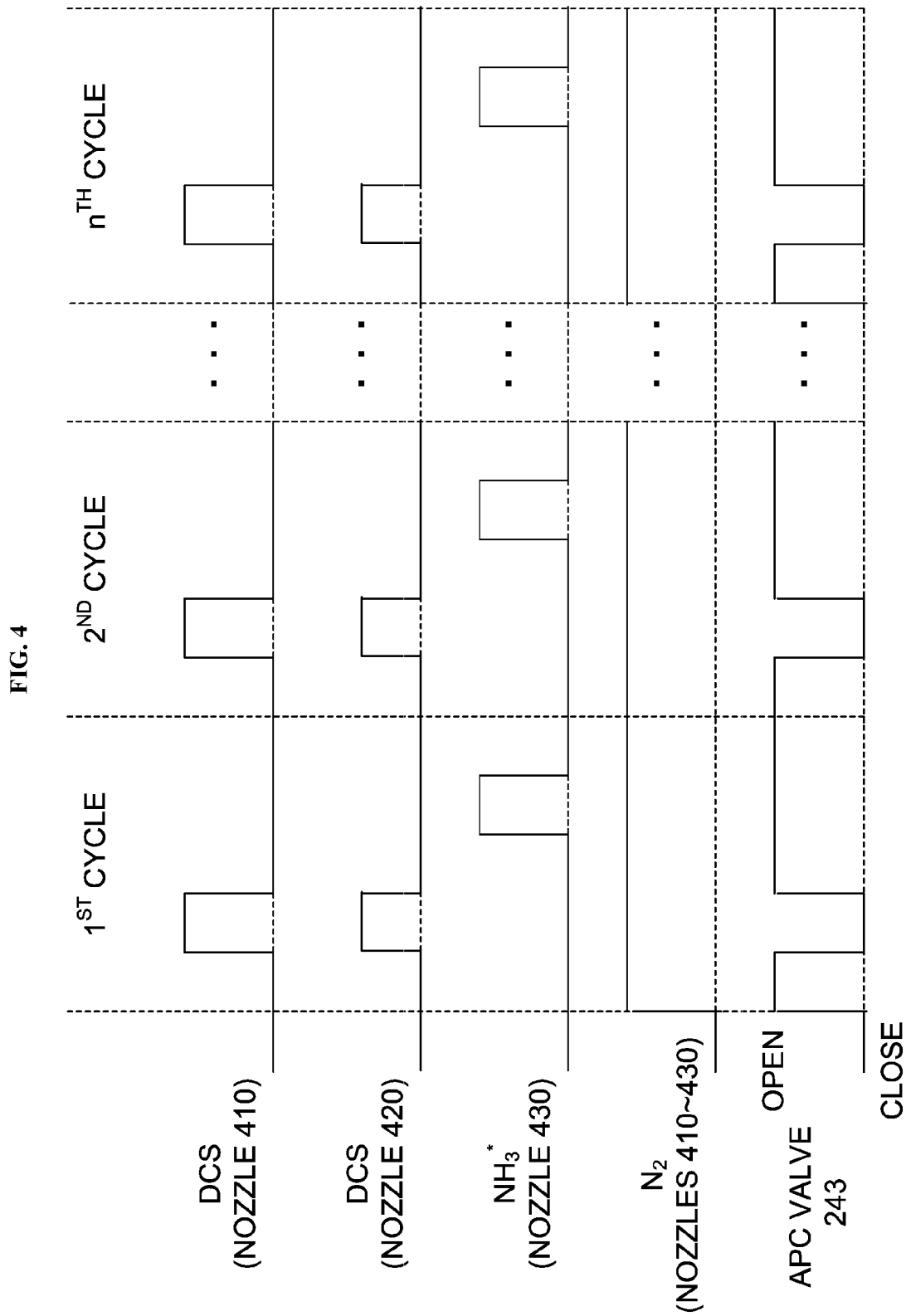
FIG. 4 schematically illustrates an exemplary film-forming sequence according to the embodiments described herein.

The exemplary sequence of the film-forming process shown in FIG. 4 includes performing a cycle a predetermined number of times (n times, where n is an integer equal to or greater than 1) to form a film containing silicon and nitrogen (that is, a silicon nitride film (SiN film)) serving as the film on the wafer 200. For example, the cycle includes: a first step (also referred to as a "step A") of supplying DCS gas serving as the first process gas to the wafer 200 in the process chamber 201; and a second step (also referred to as a "step B") of supplying NH3 gas serving as the second process gas having a chemical structure (molecular structure) different from that of the first process gas to the wafer 200 in the process chamber 201, wherein the step A and the step B are non-simultaneously performed.

For example, the step A includes: a first gas supply step (also referred to as a "sub-step A1") of supplying the DCS gas temporarily stored in the buffer tank 315 toward the wafer 200 through the gas supply port 411; and a second gas supply step (also referred to as a "sub-step A2") of supplying the DCS gas temporarily stored in the buffer tank 325 toward the wafer 200 through the gas supply port 421.

In the sub-step A1, the DCS gas is supplied from the outer periphery of the wafer 200 toward the center 200c of the wafer 200. That is, in the sub-step A1, the DCS gas is supplied through the gas supply port 411 along the L1 direction. In the sub-step A2, the DCS gas is supplied from the outer periphery of the wafer 200 along a direction more inclined toward the outer periphery of the wafer 200 than a direction from the outer periphery toward the center 200c of the wafer 200. That is, in the sub-step A2, the DCS gas is supplied through the gas supply port 421 along the L2 direction.

In the step A, that is, in the sub-step A1 and the sub-step A2, the vacuum pump 246 exhausts the process chamber 201 until the inner pressure of the process chamber 201 is equal to or lower than a predetermined pressure. Thereafter, while the APC valve 243 is closed and the exhaust system is closed (that is, exhaust of process chamber 201 by the exhaust system is stopped), each of the DCS gas stored in the buffer tank 315 with high pressure and the DCS gas stored in the buffer tank 325 with high pressure is supplied into the process chamber 201 at once, and then is confined in the process chamber 201.

In the present specification, the exemplary sequence of the film-forming process shown in FIG. 4 may be represented as follows:

The same also applies to modified examples and other embodiments described later.

In the present specification, the term "wafer" may refer to "a wafer itself" or refer to "a wafer and a stacked structure (aggregated structure) of a predetermined layer (or layers) or a film (or films) formed on a surface of the wafer". In addition, "a surface of a wafer" refers to "a surface of the wafer itself" or "a surface of a predetermined layer (or layers) or a film (or films) formed on the wafer, that is, a top surface of the wafer as a stacked structure". Thus, in the present specification, "forming a predetermined layer (or film) on a wafer" may refer to "forming a predetermined layer (or film) on a surface of the wafer itself" or refer to "forming a predetermined layer (or film) on a surface of another layer or a film formed on the wafer". In the present specification, "substrate" and "wafer" may be used as substantially the same meaning. That is, the term "substrate" may be substituted by "wafer" and vice versa.

<Wafer Charging and Boat Loading Step>

After the plurality of the wafers including the wafer 200 is transferred (charged) to the boat 217 (wafer charging step), the lower end opening of the reaction tube 203 is opened. Thereafter, the boat 217 charged with the plurality of the wafers is elevated by the boat elevator 115 and loaded (transferred) into the process chamber 201 (boat loading step). As shown in FIG. 1, with the boat 217 loaded, the seal cap 219 hermetically seals (closes) the lower end opening of the reaction tube 203.

<Pressure Adjusting and Temperature Adjusting Step>

The vacuum pump 246 exhausts (vacuum-exhausts) the inner atmosphere of the process chamber 201 such that the inner pressure of the process chamber 201 reaches a desired pressure and maintains the desired pressure (pressure adjusting step). In addition, the heater 207 heats the process chamber 201 such that the inner temperature of the process chamber 201 reaches a desired temperature and maintains the desired temperature (temperature adjusting step). In the pressure adjusting and temperature adjusting step, the plurality of the wafers including the wafer 200 is rotated by the rotating mechanism 267 (rotating step). The vacuum pump 246 continues to exhaust the inner atmosphere of the process chamber 201, the heater 207 continues to heat the process chamber 201, and the rotating mechanism 267 continues to rotate the plurality of the wafers at least until the substrate processing of the wafer 200 is completed.

<Film-Forming Step>

Thereafter, the following steps A and B are performed sequentially. In the step A, as an example, the sub-step A1 and the sub-step A2 described above are performed simultaneously.

<Step A>

By opening the valves 314 and 324 with the valves 313, 323, 612 and 622 closed, the DCS gas whose flow rate is adjusted by the MFCs 312 and 322 is filled into the buffer tanks 315 and 325, respectively. The buffer tanks 315 and 325 are filled with the DCS gas such that the inner pressures of the buffer tanks 315 and 325 reach, for example, 20,000 Pa or higher. The amount of the DCS gas filled in the each of the buffer tanks 315 and 325 is, for example, 100 cc to 250 cc. When each of the buffer tanks 315 and 325 is filled with the DCS gas of a predetermined pressure and a predetermined amount, the valves 314 and 324 are closed.

While the buffer tanks 315 and 325 are filled with the DCS gas, the inner atmosphere of the process chamber 201 is exhausted such that the inner pressure of the process chamber 201 is adjusted to a predetermined pressure of 20 Pa or less, for example. After filling the buffer tanks 315 and 325 with the DCS gas and exhausting the inner atmosphere of the process chamber 201, the APC valve 243 is closed to close the exhaust system, and the valves 313 and 323 are opened. Thereby, it is possible to supply ("flash-supply") the gas stored in the buffer tanks 315 and 325 with high pressure into the process chamber 201 at once. The inner pressure of the process chamber 201 is elevated rapidly and reaches a pressure ranging from 800 Pa to 1,200 Pa, for example. Thereafter, with the DCS gas is confined in the process chamber 201, the plurality of the wafers including the wafer 200 is exposed to an atmosphere of the DCS gas for a predetermined time (DCS gas supply step). When the plurality of the wafers is exposed to the atmosphere of the DCS gas, the valves 513, 523 and 533 are opened to supply the N2 gas into the process chamber 201 in order to prevent the DCS gas from entering the nozzles 410, 420 and 430.

In the step A, by using a pressure difference between the buffer tank 315 and the process chamber 201 and a pressure difference between the buffer tank 325 and the process chamber 201, it is possible to increase each of a flow velocity of the DCS gas supplied into the process chamber 201 through the gas supply ports 411 and a flow velocity of the DCS gas supplied into the process chamber 201 through the gas supply ports 421. Each of the flow velocity of the DCS gas supplied into the process chamber 201 through the gas supply ports 411 and the flow velocity of the DCS gas supplied into the process chamber 201 through the gas supply ports 421 is set such that the DCS gas passes through the nozzles 410 and 420 in a very short time without staying in the nozzles 410 and 420 and diffuses on the wafer 200 at once. Specifically, by accelerating each of a velocity of the DCS gas ejected through the gas supply ports 411 into the process chamber 201 and a velocity of the DCS gas ejected through the gas supply ports 421 into the process chamber 201 to, for example, about the speed of sound (340 m/sec), it is possible to increase the velocity of the DCS gas flowing on the wafer 200 to, for example, about several tens of msec. As a result, it is possible for the DCS gas to diffuse efficiently throughout the process chamber 201. Hereinafter, the method of supplying the gas (the DSC gas) described above is also referred to as a "flash flow".

In the step A, the gas is supplied using the pressure difference between the buffer tank 315 and the process chamber 201 and the pressure difference between the buffer tank 325 and the process chamber 201. Therefore, the flow velocity of the DCS gas supplied through the gas supply ports 421 into the process chamber 201 and the flow velocity of the DCS gas supplied through the gas supply ports 411 into the process chamber 201 are substantially the same. For example, the flow velocity of the DCS gas supplied through the gas supply ports 421 into the process chamber 201 is 0.8 times or more and 1.2 times or less than the flow velocity of the DCS gas supplied through the gas supply ports 411 into the process chamber 201.

In the step A, the temperature of the heater 207 is set to be within a range from 350° C. to 650° C. In the present specification, a numerical range represented by using "from A to B" includes A and B as a lower limit and an upper limit, respectively, of the numerical range. Therefore, for example, a numerical range of a temperature ranging "from 350° C. to 650° C." means a range equal to or higher than 350° C. and equal to or lower than 650° C. The same also applies to all numerical ranges of parameters described herein such as a pressure. Each of the flow rates of the N2 gas controlled by the MFCs 512, 522 and 532 is set to be within a range from 300 sccm to 10,000 sccm, for example. The time duration of confining the DCS gas in the process chamber 201 is set to be within a range from 1 second to 30 seconds, for example.

By supplying the DCS gas to the wafer 200 under the above-described conditions, it is possible to form a silicon (Si)-containing layer on the wafer 200 (that is, on a base film of the surface of the wafer 200).

After the silicon-containing layer is formed on the wafer 200, the valves 313 and 323 are closed. Then, the APC valve 243 is opened to open the exhaust system, and the inner atmosphere of the process chamber 201 is exhausted (residual gas removing step). When the inner atmosphere of the process chamber 201 is exhausted, the valves 513, 523 and 533 are opened to supply the N2 through the gas supply pipes 510, 520 and 530 in order to purge the inner atmosphere of the process chamber 201 (purging step).

<Step B>

After the step A is completed, with the valve 632 closed, the valve 333 is opened to supply the NH3 into the gas supply pipe 330. The NH3 gas whose flow rate is adjusted by the MFC 332 is supplied into the buffer chamber 433 through the plurality of the gas supply ports including the gas supply port 431. When the NH3 gas is supplied, by applying the high frequency power between the rod-shaped electrodes 471 and 472, the NH3 gas supplied into the buffer chamber 433 is excited by the plasma (that is, excited into a plasma state) and supplied into the process chamber 201 through the plurality of the gas supply ports including the gas supply port 435, and is exhausted through the exhaust pipe 231. In the step B, the NH3 gas activated by the plasma (also referred to as "NH3*") is supplied to the wafer 200 (NH3* gas supplying step). In the step B, at least the valves 513 and 523 are opened to supply the N2 gas into the process chamber 201 in order to prevent the NH3 gas from entering the nozzles 410 and 420.

In the step B, the inner pressure of the process chamber 201 is set within a range from 10 Pa to 100 Pa, for example. By using the plasma, it is possible to activate the NH3 gas even when the inner pressure of the process chamber 201 is set within a relatively low pressure range described above. A partial pressure of the NH3 gas in the process chamber 201 is set within a range from 6 Pa to 100 Pa, for example. The flow rate of the NH3 gas supplied into the process chamber 201 is set within a range from 10 sccm to 10,000 sccm, for example. The time duration (supply time) of the NH3 gas is set within a range from 1 second to 120 seconds, for example. The magnitude of the high frequency power applied between the rod-shaped electrodes 471 and 472 is within a range from 50 W to 1,000 W, for example. Other processing conditions are the same as the processing conditions in step A.

By supplying the NH3 gas to the wafer 200 under the above-described conditions, it is possible to modify (nitride) at least a part of the silicon-containing layer formed on the wafer 200. Thereby, it is possible to form a layer containing silicon and nitrogen, that is, a silicon nitride layer (SiN layer) on the wafer 200.

After the silicon nitride layer is formed on the wafer 200, the valve 333 is closed to stop the supply of the NH3 gas into the process chamber 201 through the buffer chamber 433. In addition, the application of the high frequency power between the rod-shaped electrodes 471 and 472 is stopped. Then, the APC valve 243 is opened to open the exhaust system, and the inner atmosphere of the process chamber 201 is exhausted (residual gas removing step). When the inner atmosphere of the process chamber 201 is exhausted, the valves 513, 523 and 533 are opened to supply the N2 through the gas supply pipes 510, 520 and 530 in order to purge the inner atmosphere of the process chamber 201 (purging step).

<Performing a Predetermined Number of Times>

By performing the cycle wherein the step A and the step B are performed non-simultaneously in this order a predetermined number (n) of times (at least once), the SiN film of a desired thickness and a desired composition is formed on the wafer 200. It is preferable that the cycle is performed a plurality of times. That is, the cycle is performed (repeated) until a total thickness of the SiN film formed by stacking the silicon nitride layer by performing the cycle a plurality of times reaches the desired thickness under the conditions that the silicon nitride layer formed in each cycle is thinner than the desired thickness.

<Purging and Returning to Atmospheric Pressure Step>

After the film-forming step is completed (that is, the SiN film is formed on the wafer 200) the N2 gas is supplied into the process chamber 201, and then the N2 gas supplied into the process chamber 201 is exhausted through the exhaust pipe 231. The N2 gas serves as a purge gas. The inner atmosphere of the process chamber 201 is purged with the N2 gas, thus the gas remaining in the process chamber 201 or the reaction by-products remaining in the process chamber 201 are removed from the process chamber 201 (purging step). Thereafter, the inner atmosphere of the process chamber 201 is replaced with the inert gas (substitution by inert gas), and the inner pressure of the process chamber 201 is returned to the atmospheric pressure (returning to atmospheric pressure step).

<Boat Unloading and Wafer Discharging Step>

Thereafter, the seal cap 219 is lowered by the boat elevator 115 and the lower end opening of the reaction tube 203 is opened. The boat 217 with the plurality of processed wafers including the wafer 200 charged therein is transferred (unloaded) out of the reaction tube 203 (boat unloading step). After the boat 217 is unloaded out of the reaction tube 203, the plurality of the processed wafers including the wafer 200 is transferred (discharged) out of the boat 217 (wafer discharging step).

(3) Effects According to the Embodiments

According to the embodiments, it is possible to provide one or more advantageous effects described below.

(a) In the step A, when supplying the DCS gas by the flash flow described above, the DCS gas is supplied from the outer periphery of the wafer 200 toward the center 200c of the wafer 200 using the gas supply ports 411 (that is, the DCS gas is supplied along the L1 direction). In addition, the DCS gas is supplied from the outer periphery of the wafer 200 along the direction more inclined toward the outer periphery of the wafer 200 than a direction from the outer periphery of the wafer 200 toward the center 200c of the wafer 200 using the gas supply ports 421 (that is, the DCS gas is supplied along the L2 direction). As a result, it is possible to improve the controllability of thickness distribution of the SiN film formed on the wafer 200 (hereinafter, also simply referred to as a "film thickness distribution on the wafer 200").

When the DCS gas is supplied to the wafer 200 only along the L1 direction using only the gas supply ports 411, the thickness distribution of the SiN film formed on the wafer 200 may be, for example, a distribution that the thickness of the SiN film is the thickest in the vicinity of the center of the wafer 200 and the thinnest in the vicinity of the outer periphery of the wafer 200 (hereinafter also referred to as a "central convex distribution"). It is possible to change the film thickness distribution on the wafer 200 by changing the conditions such as the supply amount (flow rate) of the DCS gas, the time duration of confining the DCS gas in the process chamber 201 and the flow rate of the N2 gas supplied simultaneously with the DCS gas. However, as will be described later, the amount of change of the film thickness distribution on the wafer 200 is small and limited particularly in a specific region on the wafer 200. Therefore, it is often difficult to adjust the film thickness distribution on the wafer 200 to a desired distribution. That is, in consideration of factors such as the uniformity of the film between the plurality of the wafers (hereinafter, also simply referred to as the "uniformity between the wafers") and the suppression of the particle generation, if the DCS gas is supplied to the wafer 200 only along the L1 direction using only the gas supply ports 411, it is practically difficult to change the film thickness distribution on the wafer 200 selectively (freely) among the following three distributions: the central convex distribution; a thickness distribution where the thickness change of the SiN film is small throughout the entire region from the vicinity of the center of the wafer 200 to the vicinity of the outer periphery thereof (hereinafter also referred to as a "flat distribution"); and a thickness distribution where the thickness of the SiN film is the thinnest in the vicinity of the center of the wafer 200 and increases as it goes closer to the outer periphery of the wafer 200 (hereinafter also referred to as a "central concave distribution").

However, according to the embodiments, when the DCS gas is supplied through the gas supply ports 421 along the L2 direction in addition to the DCS gas supplied through the gas supply ports 411, it is possible to arbitrarily control the formation of the SiN film at an outer peripheral portion of the wafer 200. As a result, it is possible to easily adjust the thickness distribution of the SiN film formed on the wafer 200 to a desired distribution. More specifically, by changing a ratio of the supply amount of the DCS gas supplied through the gas supply ports 411 to the supply amount of the DCS gas supplied through the gas supply ports 421 or by changing the angle θ between the L2 direction and the L3 direction, it is possible to easily adjust the film thickness distribution on wafer 200 to the desired distribution. For example, it is possible to easily control the film thickness distribution on wafer 200 such that the central convex distribution changes toward the flat distribution, or the flat distribution changes toward the central concave distribution.

In addition, the disclosers of the present application have confirmed that it is possible to obtain the effects described above remarkably by supplying the DCS gas through the gas supply ports 421 along the L2 direction instead of the direction toward the center 200c of the wafer 200. Theoretically, even when the DCS gas is supplied through the gas supply ports 421 toward the center 200c of the wafer 200, it may be possible to obtain the same effects according to the embodiments by appropriately adjusting the flow velocity of the DCS gas. However, when the DCS gas is supplied by the flash flow using the pressure difference between the buffer tank 325 and the process chamber 201 as in the embodiments, it is difficult to adjust the flow velocity of the DCS gas supplied through the gas supply ports 421 to a desired flow velocity. Therefore, it is difficult to control the thickness distribution of the SiN film formed on the wafer 200 to a desired distribution (for example, to control the thickness distribution such that the central convex distribution changes toward the flat distribution).

(b) By setting the L2 direction to a predetermined direction between the L3 direction and the L4 direction, it is possible to obtain the effects described above reliably. In addition, by setting the L2 direction to a predetermined direction between the L1' direction and the L4 direction, it is possible to obtain the effects described above more reliably. In addition, by setting the angle θ between the L2 direction and the L3 direction to a predetermined angle ranging from 24° to 30°, it is possible to obtain the effects described above more remarkably. When the angle θ is less than 24°, it is difficult to control the film thickness distribution on the wafer 200 to change toward the central concave distribution by changing the ratio of the supply amount of the DCS gas supplied through the gas supply ports 411 to the supply amount of the DCS gas supplied through the gas supply ports 421. When the angle θ is greater than 30°, it is difficult to control the film thickness distribution on wafer 200 to change toward the central convex distribution by changing the ratio of the supply amount of the DCS gas supplied through the gas supply ports 411 to the supply amount of the DCS gas supplied through the gas supply ports 421.

(c) By individually adjusting the amount of the DCS gas stored in the buffer tank 315 and the amount of the DCS gas stored in the buffer tank 325 in the step A, it is possible to independently control a formation efficiency of the SiN film in the vicinity of the center of the wafer 200 and a formation efficiency of the SiN film in the vicinity of the outer periphery of the wafer 200, and it is also possible to improve the controllability of the thickness distribution of the SiN film formed on the wafer 200.

For example, in the step A, it is possible to control the formation efficiency of the SiN film in the vicinity of the center of the wafer 200 relatively high and the formation efficiency of the SiN film in the vicinity of the outer periphery of the wafer 200 relatively low by controlling the first gas supply systems 301 and 302 to reduce the ratio of the amount of the DCS gas stored in the buffer tank 325 to the amount of the DCS gas stored in the buffer tank 315. That is, it is possible to control the thickness distribution of the SiN film formed on the wafer 200 to change from the central concave distribution toward the flat distribution, and from the flat distribution toward the central convex distribution.

When the buffer tanks 315 and 325 are filled with the DCS gas in the step A, it is possible to adjust the ratio of the amounts of the DCS gas stored in each of the buffer tanks 315 and 325 by, for example, controlling the MFCs 312 and 322 to adjust a ratio of the flow rates of the DCS gas supplied respectively to the buffer tanks 315 and 325 or by adjusting a ratio of the time durations of filling the buffer tanks 315 and 325, respectively, with the DCS gas (that is, the time durations of opening the valves 314 and 324, respectively, to supply the DCS gas respectively to the buffer tanks 315 and 325).

For example, in the step A, it is possible to control the formation efficiency of the SiN film in the vicinity of the center of the wafer 200 relatively low and the formation efficiency of the SiN film in the vicinity of the outer periphery of the wafer 200 relatively high by controlling the first gas supply systems 301 and 302 to increase the ratio of the amount of the DCS gas stored in the buffer tank 325 to the amount of the DCS gas stored in the buffer tank 315. That is, it is possible to control the thickness distribution of the SiN film formed on the wafer 200 to change from the central convex distribution toward the flat distribution, and from the flat distribution toward the central concave distribution.

As described above, by controlling the ratio of the amount of the DCS gas stored in the buffer tank 315 and the amount of the DCS gas stored in the buffer tank 325 to a predetermined ratio, it is also possible to improve the controllability of the film thickness distribution on the wafer 200. For example, it is possible to adjust the film thickness distribution on the wafer 200 to a desired distribution.

(d) By individually adjusting the amount of the DCS gas stored in the buffer tank 315 and the amount of the DCS gas stored in the buffer tank 325 in the step A, it is possible to control the thickness distribution of the SiN film formed on the wafer 200, and it is also possible to control a thickness distribution (also referred to as a "film thickness distribution between the wafers") of the SiN films formed on surfaces of the plurality of the wafers including the wafer 200.

The disclosers of the present application have confirmed that it is possible to control the film thickness distribution between the wafers such that an average thickness of the SiN film formed on a wafer disposed in the upper portion of the reaction tube 203 (hereinafter, also referred to as an "upper wafer") is greater than an average thickness of the SiN film formed on a wafer disposed in the lower portion of the reaction tube 203 (hereinafter, also referred to as a "lower wafer") by, for example, controlling the first gas supply systems 301 and 302 to increase the ratio of the amount of the DCS gas stored in the buffer tank 325 to the amount of the DCS gas stored in the buffer tank 315 in the step A.

The disclosers of the present application have confirmed that it is possible to control the film thickness distribution between the wafers such that the average thickness of the SiN film formed on the lower wafer is greater than the average thickness of the SiN film formed on the upper wafer by, for example, controlling the first gas supply systems 301 and 302 to reduce the ratio of the amount of the DCS gas stored in the buffer tank 325 to the amount of the DCS gas stored in the buffer tank 315 in the step A.

(e) The same advantageous effects described above may also be obtained similarly when the source gas described above other than the DSC gas is used as the first process gas, when the nitriding gas described above other than the NH3 gas is used as the second process gas, or when the rare gas described above other than the N2 gas is used as the inert gas.

Other Embodiments

While the technique is described in detail by way of the above-described embodiments, the above-described technique is not limited thereto. The above-described technique may be modified in various ways without departing from the gist thereof.

For example, a film such as a silicon oxide film (SiO film), a silicon nitride film (SiN film), a silicon carbonitride film (SiCN film), silicon oxynitride film (SiON film), a silicon oxycarbide film (SiOC film) and a silicon oxycarbonitride film (SiOCN film) may be formed on the substrate by the following film-forming sequences using various gases such as an oxygen (O)-containing gas such as oxygen (O2) gas, a carbon (C)-containing gas such as propylene (C3H6) gas and a gas containing nitrogen (N) and carbon (C) such as triethylamine ((C2H5)3N, abbreviated as TEA) gas as the second process gas. It is possible to obtain the same effects according to the embodiments when the technique is applied to form the film described above such as the silicon oxide film. The processing sequences and the processing conditions when the various gases are supplied may be substantially the same as those of the above-described embodiments. It is possible to obtain the same effects according to the embodiments when the processing sequences and the processing conditions is the same as those of the above-described embodiments.

(DCS→O2)×$n$=>SiO (DCS→NH3→O2)×$n$=>SiON (DCS→C3H6→NH3)×$n$=>SiCN (DCS→C3H6→O2)×$n$=>SiOC (DCS→C3H6→NH3→O2)×$n$=>SiOCN (DCS→TEA)×$n$=>SiCN (DCS→TEA→O2)×$n$=>SiOCN

The recipe used for the substrate processing (film-forming process) may be separately prepared depending on the contents of the substrate processing, and stored in the memory device 280c through an electrical telecommunication line or the external memory device 281. When the substrate processing is started, the CPU 280a may select a proper recipe among a plurality of recipes stored in the memory device 280c, depending on the contents of the substrate processing. Thus, it is possible to form plural kinds of films having various composition ratios, qualities and thicknesses by only a single substrate processing apparatus in a universal and highly reproducible manner. Furthermore, it is possible to reduce the burden of an operator, and to start the substrate processing promptly without an operation mistake.

The above-described recipes are not limited to newly created recipes. For example, an existing recipe which is already installed in the substrate processing apparatus may be changed to a new recipe. When a recipe is to be changed, the recipe may be installed in the substrate processing apparatus through an electrical communication line or a recording medium having the recipe written therein. The input/output device 282 installed in the existing substrate processing apparatus may be operated to directly change the existing recipe which is already installed in the substrate processing apparatus to the new recipe.

While the above-described embodiments are described by way of an example in which a batch type substrate processing apparatus configured to simultaneously process a plurality of substrates is used to form the film, the above-described technique is not limited thereto. For example, the above-described technique may be applied to the film formation using a single type substrate processing apparatus configured to simultaneously process a single substrate or a small number of substrates. Further, while a substrate processing apparatus having a hot wall type process furnace is exemplified in the above-described embodiments, the above-described technique is not limited thereto. For example, the above-described technique may also be applied to the film formation using a substrate processing apparatus having a cold wall type process furnace. The film formation using these substrate processing apparatuses may be performed according to the processing sequences and the processing conditions same as those of the above-described embodiments and examples, and it is possible to obtain the same effects according to the embodiments when the substrate processing apparatuses described above are used.

While the above-described embodiments are described by way of an example in which the sub-step A1 and the sub-step A2 are simultaneously performed in the step A, the above-described technique is not limited thereto. For example, in the step A, at least one of the start timing and the end timing of each of the sub-step A1 and the sub-step A2 may be different from each other, and the sub-step A1 and the sub-step A2 may be performed non-simultaneously (asynchronously).

The above-described embodiments and the examples may be combined appropriately. In such cases, the processing sequences and the processing conditions may be set substantially the same as those of the above-described embodiments.

Experimental Example

Figure 5A:
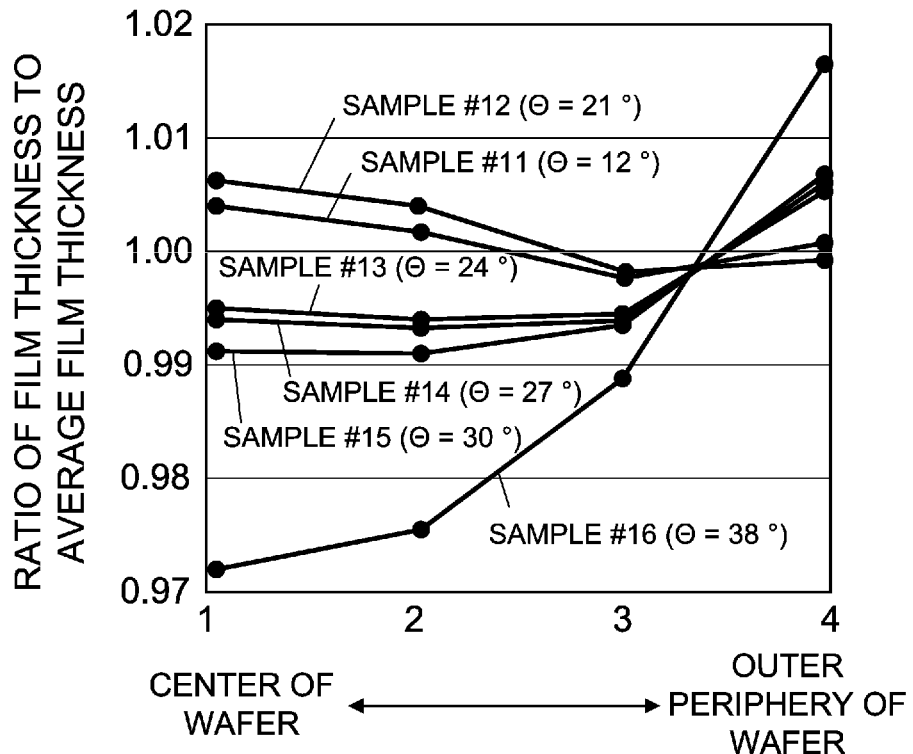
FIGS. 5A and 5B schematically illustrate measurement results of a thickness distribution of a film formed on a substrate.

Using the substrate processing apparatus shown in FIG. 1, the SiN film was formed on the wafer by the film-forming sequence shown in FIG. 4 as samples #11 to #16. The angle θ between the L2 direction and the L3 direction in each of the samples #11 to #16 was set to 12°, 21°, 24°, 27°, 30° and 38° in this order, respectively. When forming the samples #11 to #16, the amount of the DCS gas stored in the buffer tank 315 was equal to the amount of the DCS gas stored in the buffer tank 325 (that is, the ratio of the amount of the DCS gas was 1:1). Then, the thickness distribution of the SiN film formed on the wafer was measured. FIG. 5A schematically illustrates the measurement results.

The vertical axis of FIG. 5A represents a ratio of a thickness of the SiN film formed at a measurement position on the wafer to an average thickness of the SiN film (which may be denoted by "(a thickness at the measurement position)/(an average thickness)"). The horizontal axis of FIG. 5A represents the measurement positions on the wafer arranged in a sequential order, where "1" represents the center of the wafer, "2" represents a position distanced apart from the center of the wafer by ⅓ of a radius of the wafer, "3" represents a position distanced apart from the center of the wafer by ⅔ of the radius of the wafer, and "4" represents a position of the outer periphery of the wafer.

According to the measurement results shown in FIG. 5A, we can see that it is possible to control the thickness distribution of the SiN film formed on the wafer by changing the angle θ between the L2 direction and the L3 direction. For example, it is possible to adjust the thickness distribution of the SiN film formed on the wafer from the flat distribution toward the central convex distribution by decreasing θ. Also, for example, it is possible to adjust the thickness distribution of the SiN film formed on the wafer from the flat distribution toward the central concave distribution by increasing θ.

The disclosers have confirmed that, when the sub-step A2 is not performed (that is, when the DCS gas is not supplied through the gas supply port 421), or when the DCS gas is supplied through the gas supply port 421 along the L3 direction in the sub-step A2 (that is, when the angle θ is 0°), it becomes practically difficult to control the thickness distribution of the SiN film (that is, the ratio of the local film thickness to the average film thickness) as desired especially on or near the circumference whose distance from the center of the wafer is ⅔ of the radius of the wafer. That is, even when the conditions such as the supply amount of the DCS gas, the time duration of confining the DCS gas in the process chamber 201 and the flow rate of the N2 gas supplied simultaneously with the DCS gas are changed, the amount of change in the thickness distribution of the SiN film is limited on or near the above-mentioned circumference. However, according to the embodiments, it is possible to control the thickness distribution of the SiN film on or near the above-mentioned circumference with a sufficient amount of change by changing the angle θ between the L2 direction and the L3 direction. Therefore, it is possible to improve the controllability of the thickness distribution of the SiN film formed on the wafer.

Figure 5B:
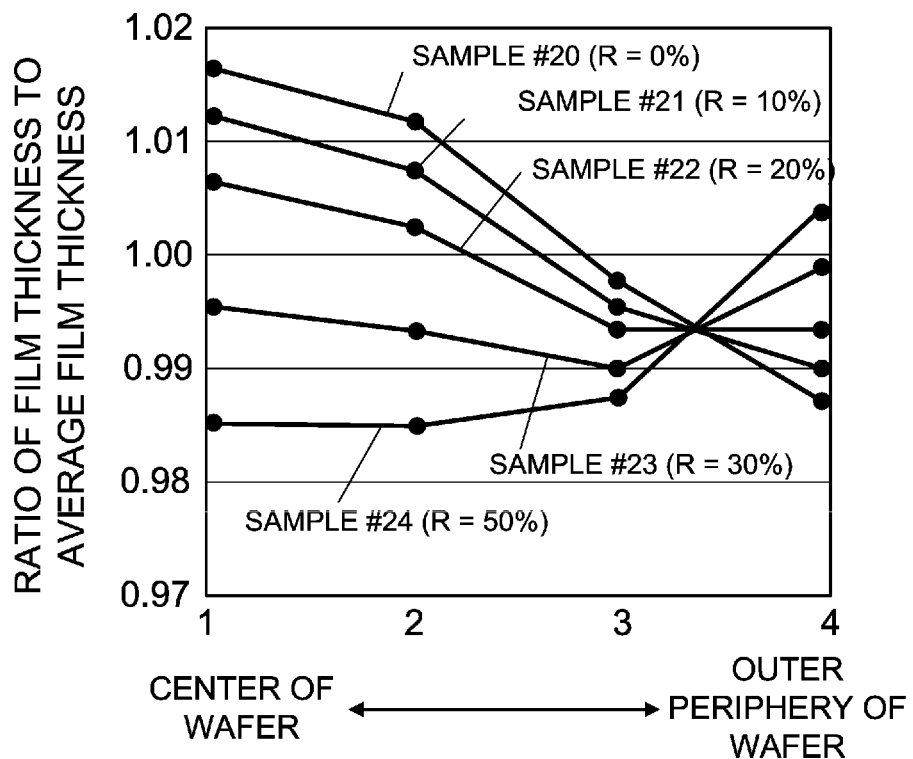

Using the substrate processing apparatus shown in FIG. 1, the SiN film was formed on the wafer as samples #20 to #24. When forming the sample #20, the DCS gas was supplied along the L1 direction and the DCS gas was not supplied along the L2 direction in the step A. That is, only the sub-step A1 was performed without performing the sub-step A2 in the step A. When forming the samples #21 to #24, the sub-step A1 and the sub-step A2 were performed in the step A according to the film-forming sequence shown in FIG. 4. With "S1 (cc)" representing the amount of the DCS gas stored in the buffer tank 315 (the amount of the DCS gas supplied in the sub-step A1) and "S2 (cc)" representing the amount of the DCS gas stored in the buffer tank 325 (the amount of the DCS gas supplied in the sub-step A2), the ratio "R" obtained by S2/S1 of each of the samples #21 to #24 was set to 10, 20, 30 and 50(%) in this order, respectively. According to the samples #20 to #24, the angle θ between the L2 direction and the L3 direction was set to 27°. Then, the thickness distribution of the SiN film formed on the wafer was measured. FIG. 5B schematically illustrates the measurement results.

The vertical axis of FIG. 5B represents the ratio of the thickness of the SiN film formed at a measurement position on the wafer to an average thickness of the SiN film (which may be denoted as "(a thickness at the measurement position)/(an average thickness)"). The horizontal axis of FIG. 5B represents the measurement positions on the wafer arranged in a sequential order, where "1" represents the center of the wafer, "2" represents the position distanced apart from the center of the wafer by ⅓ of the radius of the wafer, "3" represents the position distanced apart from the center of the wafer by ⅔ of the radius of the wafer, and "4" represents the position of the outer periphery of the wafer.

According to the measurement results shown in FIG. 5B, we can see that the uniformity of the thickness distribution of the SiN film formed on the wafer according to the samples #21 to #24 when the DCS gas is supplied along the L2 direction in the step A (that is, the sub-step A2 is performed) is better than the uniformity of the thickness distribution of the SiN film formed on the wafer according to the sample #20 when the sub-step A2 is not performed. We can also see that, when the sub-step A2 is performed in the step A, it is possible to control the thickness distribution of the SiN film formed on the wafer over a wide region by adjusting the ratio R described above. For example, by decreasing the ratio R described above, it is possible to easily control the thickness distribution of the SiN film formed on the wafer from the central concave distribution toward the flat distribution or the central convex distribution. In addition, by increasing the ratio R described above for example, it is possible to easily control the thickness distribution of the SiN film formed on the wafer from the central convex distribution toward the flat distribution or the central concave distribution.

According to the embodiments, by changing the ratio R while setting the angle θ between the L2 direction and the L3 direction to 27°, it is possible to control the thickness distribution of the SiN film (that is, the ratio of the local film thickness to the average film thickness) with a sufficient amount of change especially on or near the circumference whose distance from the center of the wafer is ⅔ of the radius of the wafer. Therefore, it is possible to improve the controllability of the thickness distribution of the SiN film formed on the wafer.

Figure 6:
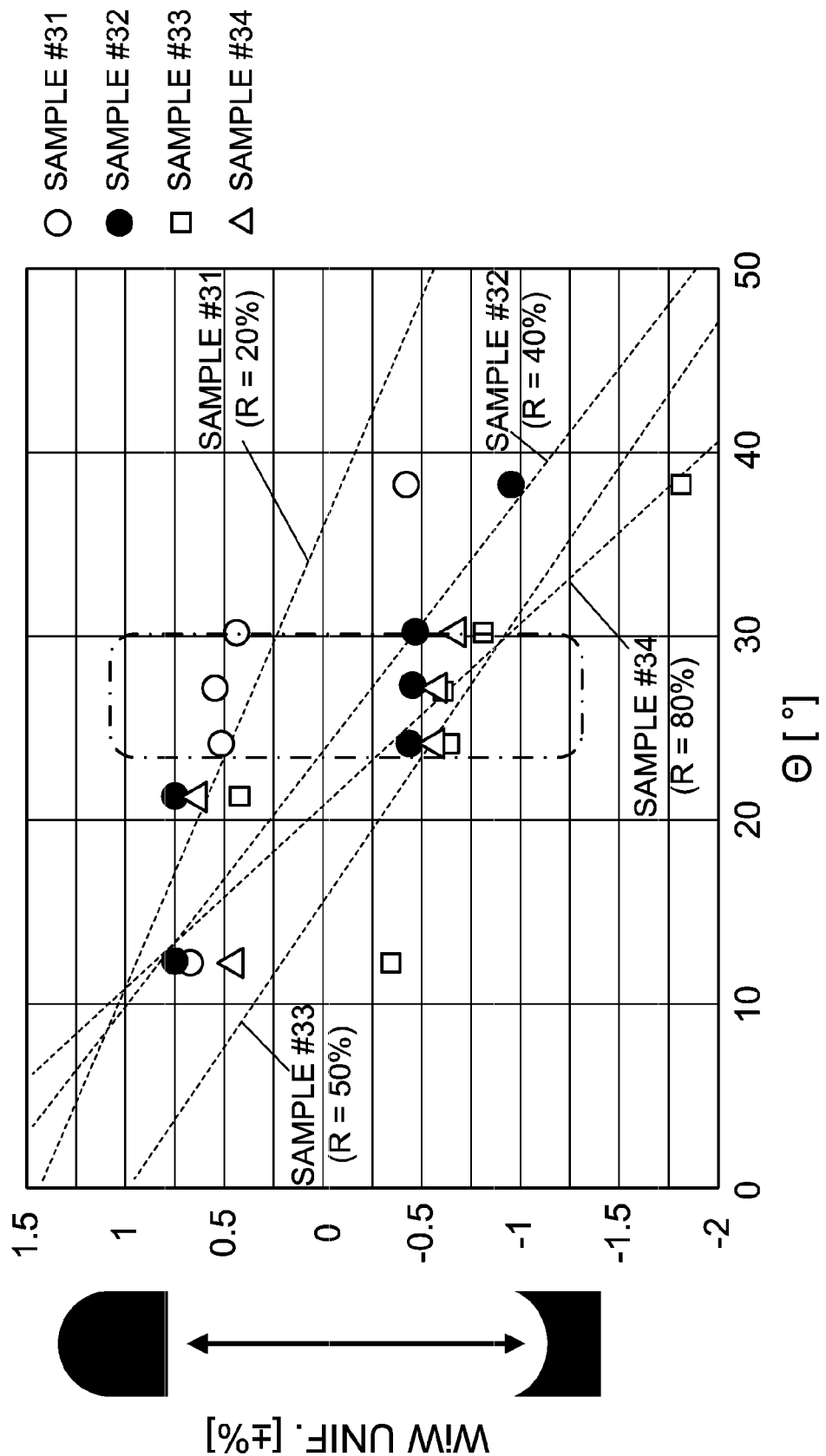
FIG. 6 schematically illustrates other measurement results of the thickness distribution of the film formed on the substrate.

Using the substrate processing apparatus shown in FIG. 1, the SiN film was formed on the wafer by the film-forming sequence shown in FIG. 4 as samples #31 to #34. The angle θ between the L2 direction and the L3 direction of each of the samples #11 to #16 was set to 12°, 21°, 24°, 27°, 30° and 38° in this order, respectively. When forming the samples #31 to #34, the ratio R of each of the samples #31 to #34 was set 20%, 40%, 50% and 80% in this order, respectively. For each ratio R, the angle θ described above was changed to 12°, 21°, 24°, 27°, 30° and 38°. Then, the thickness distribution of the SiN film formed on the wafer was measured. FIG. 6 schematically illustrates the measurement results.

The vertical axis of FIG. 6 represents the thickness uniformity of the SiN film formed on the wafer (indicated by "WiW UNIF." in FIG. 6). The thickness uniformity of the SiN film is obtained based on the maximum film thickness, the minimum film thickness and the average film thickness of the SiN film formed on the wafer (specifically by calculating: (maximum film thickness−minimum film thickness)/(2×average film thickness)×100). As the thickness uniformity increases above zero, the film thickness distribution becomes closer to the central convex distribution. Further, as the thickness uniformity decreases below zero, the film thickness distribution becomes closer to the central concave distribution. The horizontal axis of FIG. 6 represents the angle θ described above.

According to the measurement results shown in FIG. 6, we can see that it is possible to control the thickness uniformity of the SiN film formed on the wafer to become one of the central concave distribution, the flat distribution and the central convex distribution by changing the ratio R from 20% to 80% while setting the magnitude of the angle θ within a range from 24° to 30°. That is, by setting the magnitude of the angle θ within a range from 24° to 30°, it is possible to control the thickness distribution of the SiN film formed on the wafer to become a desired distribution.

According to some embodiments in the present disclosure, it is possible to improve the controllability of the thickness distribution of the film formed on the substrate.

What is claimed is:

1. A substrate processing apparatus comprising:
a process chamber in which a substrate is capable of being accommodated; and a gas supply system configured to supply a first process gas into the process chamber,
wherein the gas supply system comprises:
   a first gas supply port configured to supply the first process gas to the substrate from an outer periphery of the substrate along a first supply direction;
   a second gas supply port configured to supply the first process gas to the substrate from the outer periphery of the substrate along a second supply direction more inclined toward a tangential direction of the substrate from the second gas supply port than a direction parallel to the first supply direction; and
   a storage part configured to temporarily store the first process gas to be supplied to at least one of the first gas supply port or the second gas supply port.

2. The substrate processing apparatus of claim 1, wherein the first gas supply port is further configured to supply the first process gas toward a center portion of the substrate.

3. The substrate processing apparatus of claim 1, wherein the second supply direction does not cross the first supply direction.

4. The substrate processing apparatus of claim 1, wherein the first gas supply port and the second gas supply port are provided adjacent to each other along a circumferential direction of the substrate.

5. The substrate processing apparatus of claim 1, wherein the second gas supply port is further configured to supply the first process gas stored in the storage part along the second supply direction of a predetermined angle with respect to a direction from the second gas supply port toward a center of the substrate, the predetermined angle being within a range from 24° to 30° toward the tangential direction of the substrate.

6. The substrate processing apparatus of claim 1, further comprising:
   an exhaust system configured to exhaust the process chamber; and
   a controller configured to control the gas supply system and the exhaust system to supply the first process gas into the process chamber from the first gas supply port and the second gas supply port while the exhaust system is closed after the process chamber is exhausted.

7. The substrate processing apparatus of claim 1, wherein the storage part comprises a first storage part, and
   the gas supply system further comprises: a second storage part configured to temporarily store the first process gas to be supplied to the other of the first gas supply port and the second gas supply port.

8. The substrate processing apparatus of claim 7, further comprising:
   a controller configured to be capable of controlling the gas supply system to adjust each of an amount of the first process gas stored in the first storage part and an amount of the first process gas stored in the second storage part.

9. The substrate processing apparatus of claim 7, further comprising:
   a controller configured to be capable of controlling the gas supply system such that a ratio between an amount of the first process gas stored in the first storage part and an amount of the first process gas stored in the second storage part is adjusted to a predetermined ratio.

10. The substrate processing apparatus of claim 7, further comprising:
   a controller configured to be capable of adjusting a thickness distribution of a film formed on the substrate by changing a ratio between an amount of the first process gas stored in the first storage part and an amount of the first process gas stored in the second storage part by controlling the gas supply system.

11. The substrate processing apparatus of claim 1, wherein a plurality of substrates comprising the substrate are stacked and accommodated with a predetermined interval therebetween in the process chamber,
   a plurality of first gas supply ports comprising the first gas supply port are provided at a side portion of a first nozzle provided along a stacking direction of the plurality of substrates, and
   a plurality of second gas supply ports comprising the second gas supply port are provided at a side portion of a second nozzle provided along the stacking direction of the plurality of substrates.

12. A substrate processing method comprising:
forming a film on a substrate at least by (a) supplying a first process gas to the substrate accommodated in a process chamber,
wherein (a) comprises:
   (a-1) supplying the first process gas to the substrate through a first gas supply port, the first process gas in (a-1) being supplied from an outer periphery of the substrate along a first supply direction; and
   (a-2) supplying the first process gas to the substrate through a second gas supply port, the first process gas in (a-2) being supplied from the outer periphery of the substrate along a second supply direction more inclined toward a tangential direction of the substrate from the second gas supply port than a direction parallel to the first supply direction, the first process gas in at least one of (a-1) or (a-2) being temporarily stored in a storage part to be supplied to at least one of the first gas supply port or the second gas supply port.

13. The method of claim 12, wherein a thickness distribution of the film formed on the substrate is adjusted in (a) by changing a ratio between an amount of the first process gas stored in the storage part and an amount of the first process gas stored in a second storage part different from the storage part.

14. The method of claim 12, wherein the first process gas temporarily stored in a second storage part different from the storage part is supplied to the substrate through the second gas supply port, and
   a flow velocity of the first process gas supplied through the first gas supply port and a flow velocity of the first process gas supplied through the second gas supply port are increased in (a) by using a pressure difference between the storage part and the process chamber and a pressure difference between the second storage part and the process chamber.

15. The method of claim 14, wherein, in (a), the flow velocity of the first process gas supplied through the second gas supply port to the process chamber is 0.8 times or more and 1.2 times or less of the flow velocity of the first process gas supplied through the first gas supply port.

16. A method of manufacturing a semiconductor device comprising the method of claim 12.

17. A non-transitory computer-readable recording medium storing a program that causes, by a computer, a substrate processing apparatus to perform:
   forming a film on a substrate at least by (a) supplying a first process gas to the substrate accommodated in a process chamber of the substrate processing apparatus, wherein (a) comprises:
- (a-1) supplying the first process gas to the substrate through a first gas supply port, the first process gas in (a-1) being supplied from an outer periphery of the substrate along a first supply direction; and
- (a-2) supplying the first process gas to the substrate through a second gas supply port, the first process gas in (a-2) being supplied from the outer periphery of the substrate along a second supply direction more inclined toward a tangential direction of the substrate from the second gas supply port than a direction parallel to the first supply direction, the first process gas in at least one of (a-1) or (a-2) being temporarily stored in a storage part to be supplied to at least one of the first gas supply port or the second gas supply port.

* * * * *